(12) United States Patent
Conger

(10) Patent No.: US 12,078,913 B2
(45) Date of Patent: Sep. 3, 2024

(54) VEHICULAR CAMERA WITH LOW CTE METAL HOUSING AND PLASTIC LENS ATTACHMENT

(71) Applicant: Magna Electronics Inc., Auburn Hills, MI (US)

(72) Inventor: Jonathan D. Conger, Berkley, MI (US)

(73) Assignee: Magna Electronics Inc., Auburn Hills, MI (US)

( * ) Notice: Subject to any disclaimer, the term of this patent is extended or adjusted under 35 U.S.C. 154(b) by 230 days.

(21) Appl. No.: 17/812,766

(22) Filed: Jul. 15, 2022

(65) Prior Publication Data

US 2023/0016936 A1    Jan. 19, 2023

Related U.S. Application Data

(60) Provisional application No. 63/366,269, filed on Jun. 13, 2022, provisional application No. 63/262,148, filed on Oct. 6, 2021, provisional application No. 63/203,293, filed on Jul. 16, 2021.

(51) Int. Cl.
| | |
|---|---|
| *G03B 17/08* | (2021.01) |
| *G03B 17/12* | (2021.01) |
| *H04N 23/51* | (2023.01) |
| *H04N 23/55* | (2023.01) |
| *H05K 5/00* | (2006.01) |

(52) U.S. Cl.
CPC .............. *G03B 17/08* (2013.01); *G03B 17/12* (2013.01); *H04N 23/51* (2023.01); *H04N 23/55* (2023.01); *H05K 5/0034* (2013.01)

(58) Field of Classification Search
None
See application file for complete search history.

(56) References Cited

U.S. PATENT DOCUMENTS

| | | | |
|---|---|---|---|
| 5,412,510 | A | 5/1995 | Iizuka et al. |
| 5,550,677 | A | 8/1996 | Schofield et al. |
| 5,670,935 | A | 9/1997 | Schofield et al. |
| 5,949,331 | A | 9/1999 | Schofield et al. |
| 5,978,017 | A | 11/1999 | Tino |
| 6,151,065 | A | 11/2000 | Steed et al. |
| 7,038,577 | B2 | 5/2006 | Pawlicki et al. |
| 7,595,943 | B2 | 9/2009 | Yuan |
| 7,720,580 | B2 | 5/2010 | Higgins-Luthman |
| 7,855,755 | B2 | 12/2010 | Weller et al. |

(Continued)

FOREIGN PATENT DOCUMENTS

| | | | | |
|---|---|---|---|---|
| DE | 202020105845 U1 | * | 12/2020 | .............. B22F 3/225 |
| EP | 3244246 A1 | * | 11/2017 | .............. G02B 7/008 |

*Primary Examiner* — Rodney E Fuller
(74) *Attorney, Agent, or Firm* — HONIGMAN LLP

(57) ABSTRACT

A vehicular camera includes a printed circuit board (PCB) having an imager disposed thereat. A lens barrel accommodates a lens and includes a first end and a second end and an annular flange between the first end and the second end. A front camera housing includes a first portion having a first material having a first coefficient of thermal expansion (CTE) and a second portion having a second material having a second CTE, with the first CTE being higher than the second CTE. A rear camera housing and the second portion of the front camera housing are joined to encase the PCB within a cavity formed by joining the front camera housing and the rear camera housing.

24 Claims, 17 Drawing Sheets

(56) References Cited

U.S. PATENT DOCUMENTS

| | | |
|---|---|---|
| 7,965,336 B2 | 6/2011 | Bingle et al. |
| 8,542,451 B2 | 9/2013 | Lu et al. |
| 8,994,878 B2 | 3/2015 | Byrne et al. |
| 9,077,098 B2 | 7/2015 | Latunski |
| 9,233,641 B2 | 1/2016 | Sesti et al. |
| 9,277,104 B2 | 3/2016 | Sesti et al. |
| 9,596,387 B2 | 3/2017 | Achenbach et al. |
| 9,621,769 B2 | 4/2017 | Mai et al. |
| 9,871,971 B2 | 1/2018 | Wang et al. |
| 10,071,687 B2 | 9/2018 | Ihlenburg et al. |
| 10,099,614 B2 | 10/2018 | Diessner |
| 10,142,532 B2 | 11/2018 | Mleczko |
| 10,207,646 B2 | 2/2019 | Oh |
| 10,230,875 B2 | 3/2019 | Mleczko et al. |
| 10,250,004 B2 | 4/2019 | Conger et al. |
| 10,272,857 B2 | 4/2019 | Conger et al. |
| 10,274,812 B1 | 4/2019 | Chen |
| 10,645,795 B2 | 5/2020 | Byrne et al. |
| 10,676,041 B2 | 6/2020 | Sesti et al. |
| 10,678,018 B2 | 6/2020 | Byrne et al. |
| 10,750,064 B2 | 8/2020 | Byrne et al. |
| 10,855,890 B2 | 12/2020 | Mleczko et al. |
| 10,899,275 B2 | 1/2021 | Lu et al. |
| 10,911,647 B2 | 2/2021 | Byrne et al. |
| 11,579,400 B2 | 2/2023 | Reckker et al. |
| 2001/0055073 A1 | 12/2001 | Shinomiya |
| 2003/0090569 A1 | 5/2003 | Poechmueller |
| 2003/0128291 A1 | 7/2003 | Harazono et al. |
| 2004/0069998 A1 | 4/2004 | Harazono |
| 2007/0146908 A1 | 6/2007 | Li |
| 2007/0200053 A1 | 8/2007 | Nomura et al. |
| 2009/0244361 A1 | 10/2009 | Gebauer et al. |
| 2011/0025850 A1 | 2/2011 | Maekawa et al. |
| 2011/0279675 A1 | 11/2011 | Mano et al. |
| 2011/0298925 A1 | 12/2011 | Inoue et al. |
| 2012/0019940 A1 | 1/2012 | Lu et al. |
| 2013/0130937 A1 | 5/2013 | Sun et al. |
| 2013/0183499 A1 | 7/2013 | Kido et al. |
| 2013/0242099 A1 | 9/2013 | Sauer et al. |
| 2014/0298642 A1 | 10/2014 | Sesti et al. |
| 2014/0313337 A1 | 10/2014 | Devota et al. |
| 2014/0373345 A1 | 12/2014 | Steigerwald |
| 2015/0015713 A1 | 1/2015 | Wang et al. |
| 2015/0029337 A1 | 1/2015 | Uchiyama et al. |
| 2015/0124098 A1 | 5/2015 | Winden et al. |
| 2015/0222795 A1 | 8/2015 | Sauer et al. |
| 2015/0266430 A1 | 9/2015 | Mleczko et al. |
| 2015/0327398 A1 | 11/2015 | Achenbach et al. |
| 2015/0365569 A1 | 12/2015 | Mai et al. |
| 2015/0379361 A1 | 12/2015 | Boulanger |
| 2016/0037028 A1 | 2/2016 | Biemer |
| 2016/0191863 A1 | 6/2016 | Minikey, Jr. et al. |
| 2016/0243987 A1 | 8/2016 | Kendall |
| 2016/0268716 A1 | 9/2016 | Conger et al. |
| 2016/0284752 A1 | 9/2016 | Shi |
| 2016/0286103 A1 | 9/2016 | Van Dan Elzen |
| 2017/0036600 A1 | 2/2017 | Whitehead et al. |
| 2017/0054881 A1 | 2/2017 | Conger et al. |
| 2017/0126938 A1 | 5/2017 | Newiger |
| 2017/0129419 A1 | 5/2017 | Conger et al. |
| 2017/0133811 A1 | 5/2017 | Conger et al. |
| 2017/0201661 A1 | 7/2017 | Conger |
| 2017/0280034 A1 | 9/2017 | Hess et al. |
| 2017/0295306 A1 | 10/2017 | Mleczko |
| 2017/0302829 A1 | 10/2017 | Mleczko et al. |
| 2018/0027151 A1 | 1/2018 | Kazama et al. |
| 2018/0033741 A1 | 2/2018 | Dubey et al. |
| 2018/0042106 A1 | 2/2018 | Scheja |
| 2018/0072239 A1 | 3/2018 | Wienecke et al. |
| 2018/0098033 A1 | 4/2018 | Mleczko et al. |
| 2018/0364441 A1 | 12/2018 | Hubert et al. |
| 2019/0124238 A1 | 4/2019 | Byrne et al. |
| 2019/0124243 A1 | 4/2019 | Mleczko et al. |
| 2019/0129281 A1 | 5/2019 | Chen |
| 2019/0137724 A1 | 5/2019 | Kim et al. |
| 2019/0166289 A1 | 5/2019 | Knutsson et al. |
| 2019/0306966 A1 | 10/2019 | Byrne et al. |
| 2019/0326725 A1 | 10/2019 | Nagatomo et al. |
| 2019/0355606 A1 | 11/2019 | Flotgen |
| 2020/0001787 A1 | 1/2020 | Lu et al. |
| 2020/0033549 A1 | 1/2020 | Liu et al. |
| 2020/0070453 A1 | 3/2020 | Piotrowski et al. |
| 2020/0116994 A1* | 4/2020 | Gu .................. G03B 17/55 |
| 2020/0137926 A1 | 4/2020 | Wohlte |
| 2020/0154020 A1 | 5/2020 | Byrne et al. |
| 2020/0172019 A1 | 6/2020 | Ding et al. |
| 2020/0204711 A1 | 6/2020 | Guidi et al. |
| 2020/0333619 A1 | 10/2020 | Ang et al. |
| 2020/0409016 A1 | 12/2020 | Jiang et al. |
| 2020/0412925 A1 | 12/2020 | Byrne et al. |
| 2021/0103119 A1 | 4/2021 | Reckker et al. |

* cited by examiner

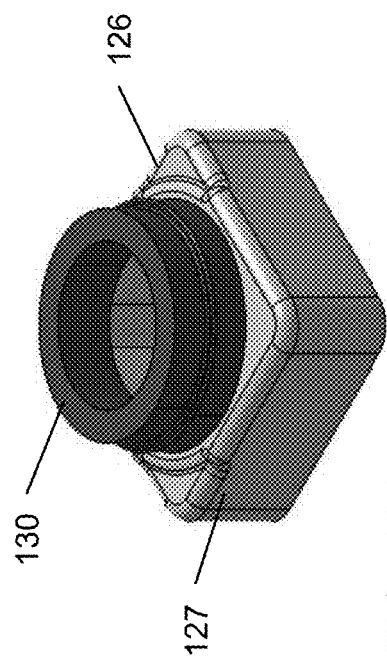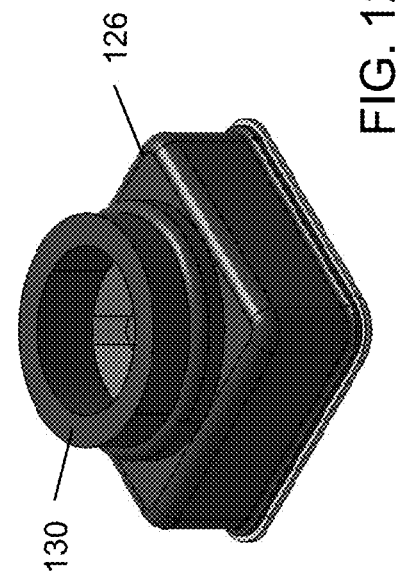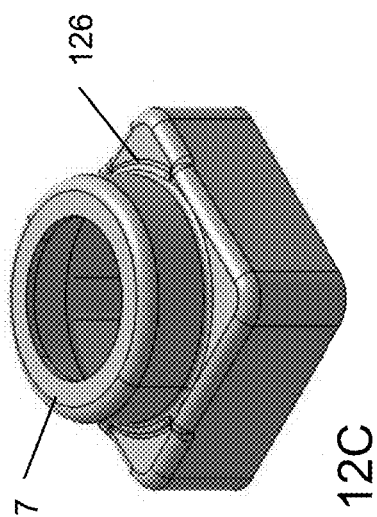
FIG. 12A
FIG. 12B
FIG. 12C

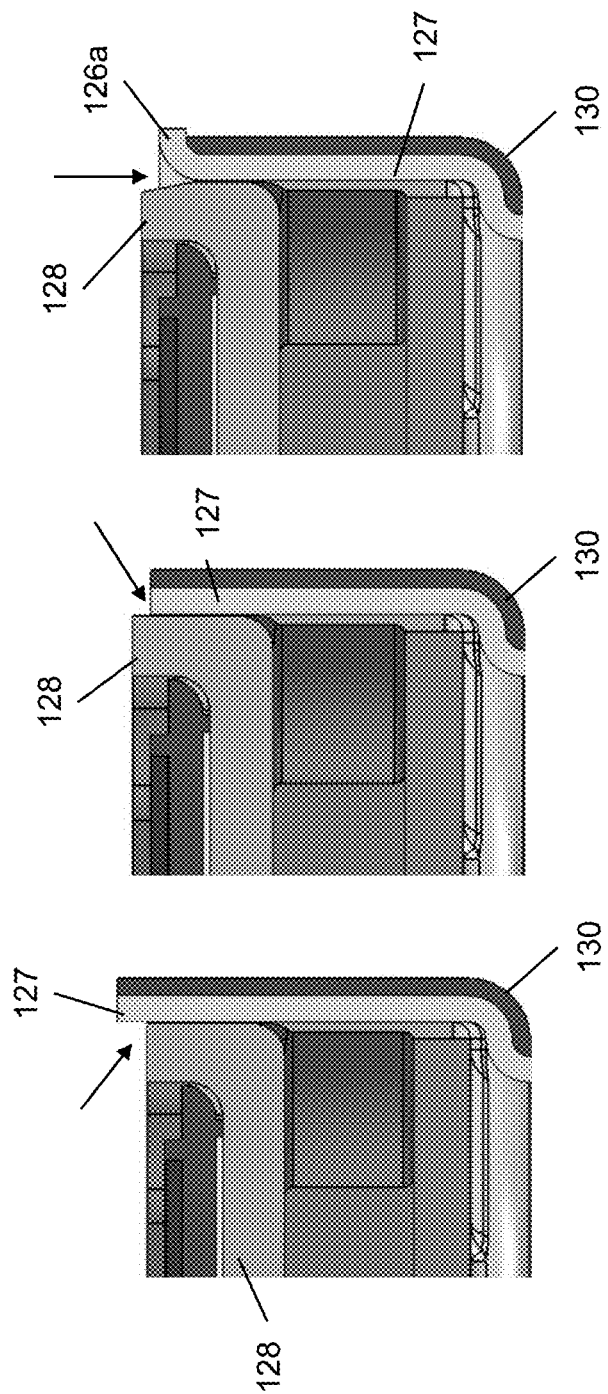

VEHICULAR CAMERA WITH LOW CTE METAL HOUSING AND PLASTIC LENS ATTACHMENT

CROSS REFERENCE TO RELATED APPLICATIONS

The present application claims priority of U.S. provisional application Ser. No. 63/366,269, filed Jun. 13, 2022, U.S. provisional application Ser. No. 63/262,148, filed Oct. 6, 2021, and U.S. provisional application Ser. No. 63/203,293, filed Jul. 16, 2021, which are hereby incorporated herein by reference in their entireties.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties.

SUMMARY OF THE INVENTION

A driving assistance system or vision system or imaging system for a vehicle utilizes one or more cameras (preferably one or more CMOS cameras) disposed at a vehicle and having a field of view exterior of the vehicle. An electronic control unit (ECU) comprises an image processor that is operable to process image data captured by the camera. The ECU, responsive to image processing of image data captured by the camera, is operable to provide driver assistance or driving assistance, such as for assisting a driver in driving the vehicle or for providing autonomous or semi-autonomous control of the vehicle, or such as for providing a display of video images for viewing by the driver, such as during a reversing or parking maneuver.

The vehicular camera includes a printed circuit board (PCB) having a first side and a second side separated by a thickness of the PCB. An imager is disposed at the first side of the PCB. The camera includes a lens barrel accommodating a lens. The lens barrel includes a first end and a second end. The camera includes a front camera housing that includes a first portion comprising a first material with a first coefficient of thermal expansion (CTE) and a second portion comprising a second material with a second CTE, wherein the first CTE is higher than the second CTE. The first portion of the front camera housing includes an annular surface, and an annular surface of the lens barrel is bonded to the annular surface of the first portion of the front camera housing via an adhesive. The camera includes a rear camera housing, and the front camera housing and the rear camera housing are joined together to encase and/or seal the PCB within a cavity formed by the front camera housing and the rear camera housing.

These and other objects, advantages, purposes and features of the present invention will become apparent upon review of the following specification in conjunction with the drawings.

BRIEF DESCRIPTION OF THE DRAWINGS

FIGS. 12A-12C are perspective views of the front housing of FIGS. 9-11 with variations of the overmolded lens attachment feature;

FIGS. 15A-15C are cross-sectional views of a welding joint between a metallic front housing and a metallic rear housing;

DESCRIPTION OF THE PREFERRED EMBODIMENTS

A vehicle vision system and/or driver or driving assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
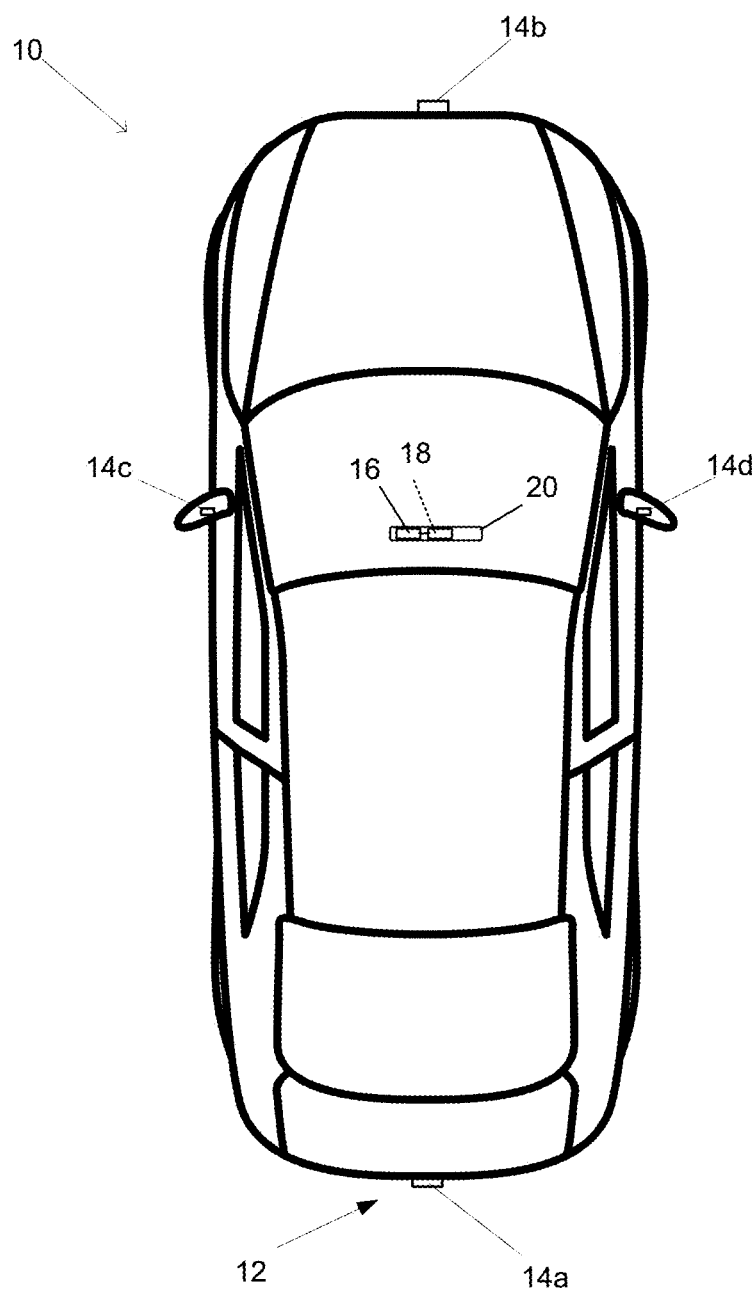
FIG. 1 is a plan view of a vehicle with a vision system that incorporates cameras.

Referring now to the drawings and the illustrative embodiments depicted therein, a vehicle 10 includes an imaging system or vision system 12 that includes at least one exterior viewing imaging sensor or camera, such as a rearward viewing imaging sensor or camera 14a (and the system may optionally include multiple exterior viewing imaging sensors or cameras, such as a forward viewing camera 14b at the front (or at the windshield) of the vehicle, and a sideward/rearward viewing camera 14c, 14d at respective sides of the vehicle), which captures images exterior of the vehicle, with the camera having a lens for focusing images at or onto an imaging array or imaging plane or imager of the camera (FIG. 1). Optionally, a forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) 18 having electronic circuitry and associated software, with the electronic circuitry including a data processor or image processor that is operable to process image data captured by the camera or cameras, whereby the ECU may detect or determine presence of objects or the like and/or the system provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

Vehicular cameras are often exposed to harsh conditions that include extreme temperature changes. These temperature changes can lead to warping of a printed circuit board (PCB) disposed within a camera housing of the camera. Warping of the PCB can lead to focus shift of the camera, as the position of the PCB, imager, and lens change relative to each other. Implementations herein include a camera that includes combining elements having low coefficient of thermal expansion (CTE) materials with elements having high CTE materials to prevent or reduce PCB bending and warping while maximizing potential PCB size. The CTE of a material is based on an amount the material expands and contracts as a result of the temperature of the material. A material with a high CTE will expand and contract a greater amount due to temperature variations than a material with a low CTE. When not properly compensated for, such expansion/contraction can result in bending and warping of components of the camera and shift alignment/focus of the lens and imager.

The camera (such as front, side, or rear cameras 14 of FIG. 1) includes a thin-walled housing portion comprising a low CTE material such as metal (e.g., steel, aluminum, or the like). The low CTE material allows the housing portion to resist changes due to temperature swings and the reduced or minimal thickness allows for an increased PCB size without risk of warping/bending due to CTE expansion. However, low CTE materials do not allow for a means to offset focal plane shift (which may occur when the distance between one or more lens elements of the camera and the imager changes, such as due to expansion and contraction of elements of the camera during temperature changes). Put another way, low CTE materials cannot offset shifting of the focal plane due to other materials within the housing, the lens barrel, the lens (particularly low cost lenses), and the like expanding or contracting due to temperature changes. To account for this, the camera 14 includes another housing portion that comprises a higher CTE material (i.e., a material with a higher CTE than the low CTE housing portion) bonded to the low CTE housing portion to act as a lens attachment surface.

Figure 2:
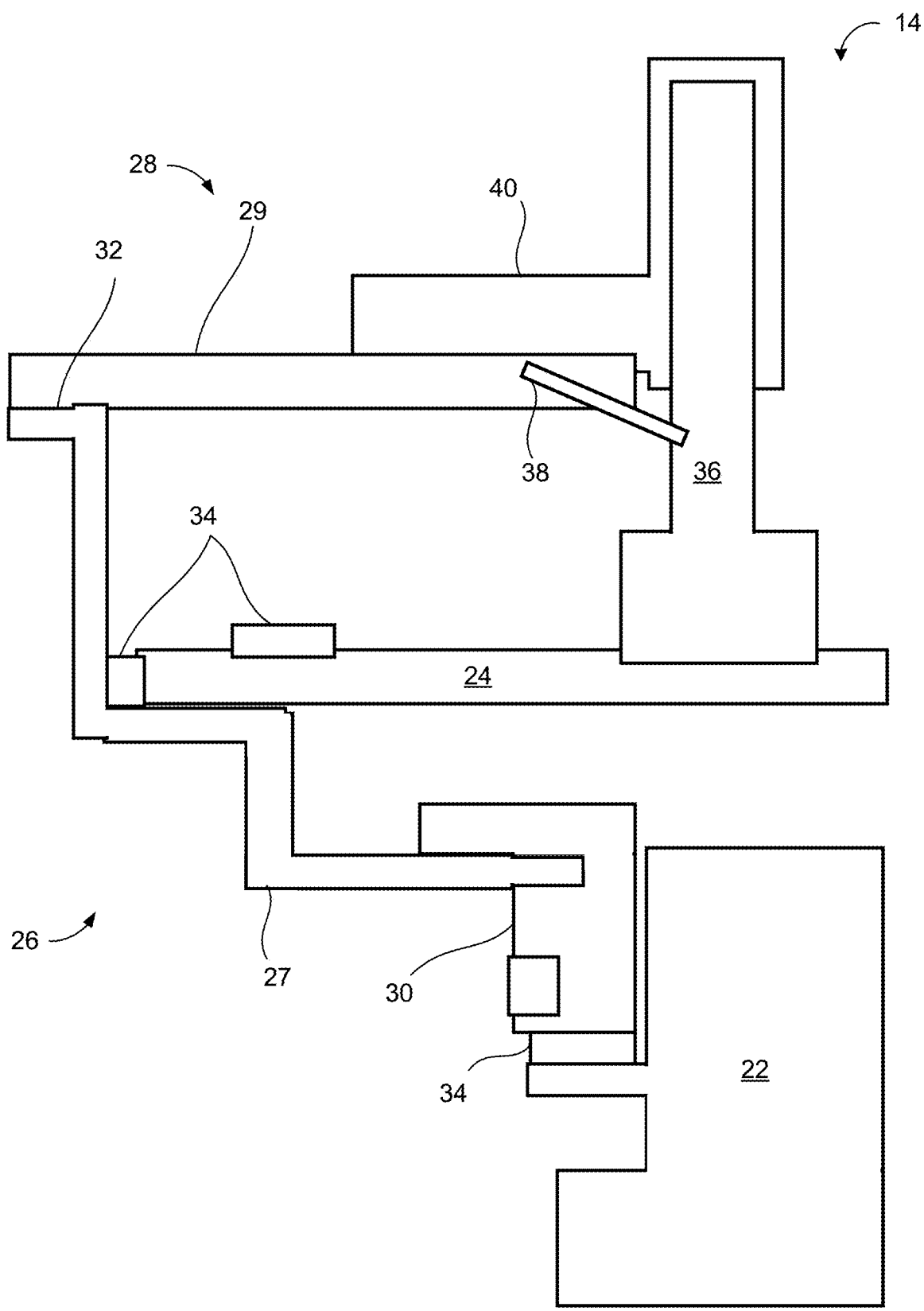
FIG. 2 is a cross-sectional view of a portion of a camera including housing portions having materials with different coefficient of thermal expansions.

Referring now to FIG. 2, the camera 14 includes a lens barrel 22 and a PCB 24. The lens barrel may include or accommodate one or more lens elements and the PCB 24 includes an imager that aligns with the lens barrel such that light that passes axially through the lens barrel (and through the one or more lens elements) is captured by the imager. The camera 14 includes a front housing portion 26 and a rear housing portion 28. The rear housing 28 and front housing 26, when mated or joined together, encapsulate the PCB 24 and portions of the lens barrel 22. The rear housing 28 may include a metal rear wall 29 that is at least 1 mm thick. The front housing 26 includes a thin wall portion 27 (e.g., less than 1 mm thick, such as approximately 0.25 mm thick, 0.5 mm thick, etc.) of a low CTE material such as metal (e.g., the same metal as the rear wall 29). The front housing 26 also includes a high CTE material portion 30 that is in contact with both the low CTE thin wall portion 27 and the lens barrel 22.

The high CTE material portion 30 may include a lens barrel support structure or other means of fixing the lens barrel in place. For example, the high CTE material portion includes overmolded plastic material that at least partially encapsulates the lens barrel 22. In FIG. 2, the high CTE portion 30 is bonded to a flange of the lens barrel 22 via an adhesive 34 (e.g., glue). The flange provides an annular surface that is mated or joined with and bonded to an annular surface of the high CTE portion 30 that is joined with the thin wall portion 27. Shrinkage or expansion of the adhesive 34 will move the lens barrel 22 along the axial path of the lens barrel 22 and the imager of the PCB 24.

Thus, the high CTE material portion 30 (e.g., overmolded plastic) compensates for movement of the lens barrel 22 and/or lens elements along a Z axis (i.e., along an axis perpendicular to the plane of the imager disposed at the PCB 24), but the low CTE thin wall portion 27 limits movement in the X axis and the Y axis (i.e., along the plane of the imager disposed at the PCB 24) so that a bond between the low CTE portion 27 and the high CTE portion 30 does not break. Moreover, the high CTE portion 30 (e.g., plastic) may bond more easily to the lens barrel 22 than more traditional low CTE material (e.g., metal).

The PCB 24 may bond to the thin wall portion 27 (i.e., the low CTE material) via the adhesive 34. The thin wall portion 27 and the rear wall 29 may be connected at a mating interface 32 via, for example, laser or friction stir welding. The PCB includes a connector 36 (e.g., a multi-pin header connector or coaxial connector) that communicates electrical signals to and from the PCB 24. The connector 36 may be grounded or electrically connected to the rear wall 29 and/or the thin wall portion 27 via an electrically conductive contact 38 (e.g., a metal stamping that is overmolded or heat staked to the rear wall or cover, or that is vacuum metallization (VM) coated to make electrical contact at the rear cover. Portions of the connector 36 and or rear housing 28 may be received in or overmolded by a connector portion 40 that is configured to electrically connect to a connector of a vehicle wire harness or cable. The rear housing 28 and/or connector 36 may include sealing to seal the interior of the camera 14 from the environment.

Figure 3:
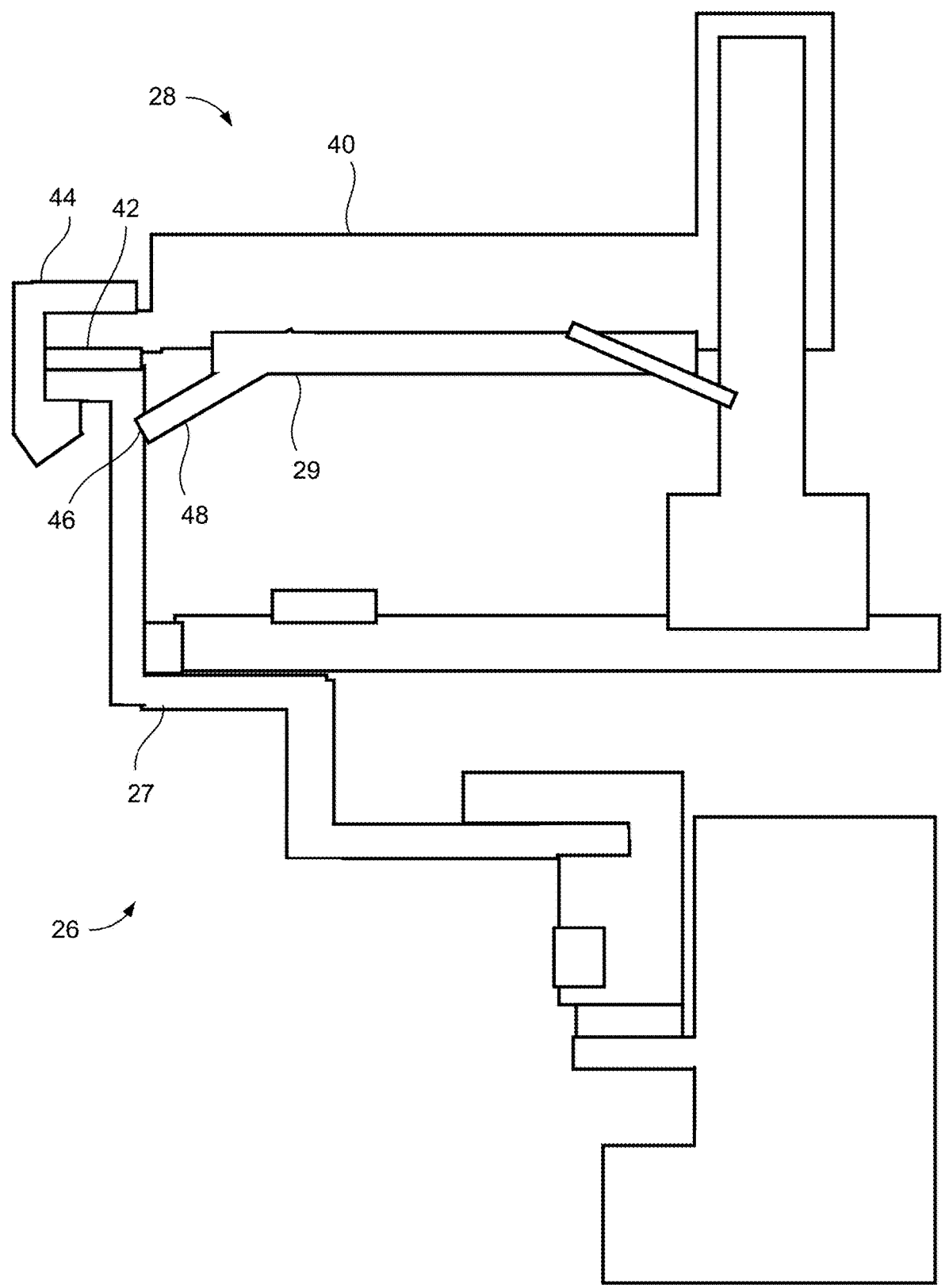
FIG. 3 is a cross-sectional view of a portion of a camera including housing portions having materials with different coefficient of thermal expansions and a snap securing a front housing and a rear housing.

Referring now to FIG. 3, in another example, the plastic rear housing or connector portion 40 may extend along the length of the rear wall 29 and mate or join with the thin wall 27 via a seal 42 or gasket or an adhesive-based pad (e.g., a silicone pad). A snap or clamp 44 (or other fastener) may engage peripheral flanges of the plastic portion 40 and of the thin wall portion 27 and retain them together (with the seal sandwiched between the peripheral flanges), thus securing and sealing the front housing 26 and the rear housing 28 together. An electromagnetic or EMC contact 48 may establish electrical contact between the metal portions of the rear wall 29 and the thin wall 27 to provide EMC shielding to reduce electromagnetic interference (EMI). Thus, the camera of FIG. 3 offers an alternative means of fastening the rear housing 28 by using, for example, a plastic snap 44 to hold the front housing 26 and rear housing 28 together. The snap 44 may be an extension of an existing bracket.

Figure 4:
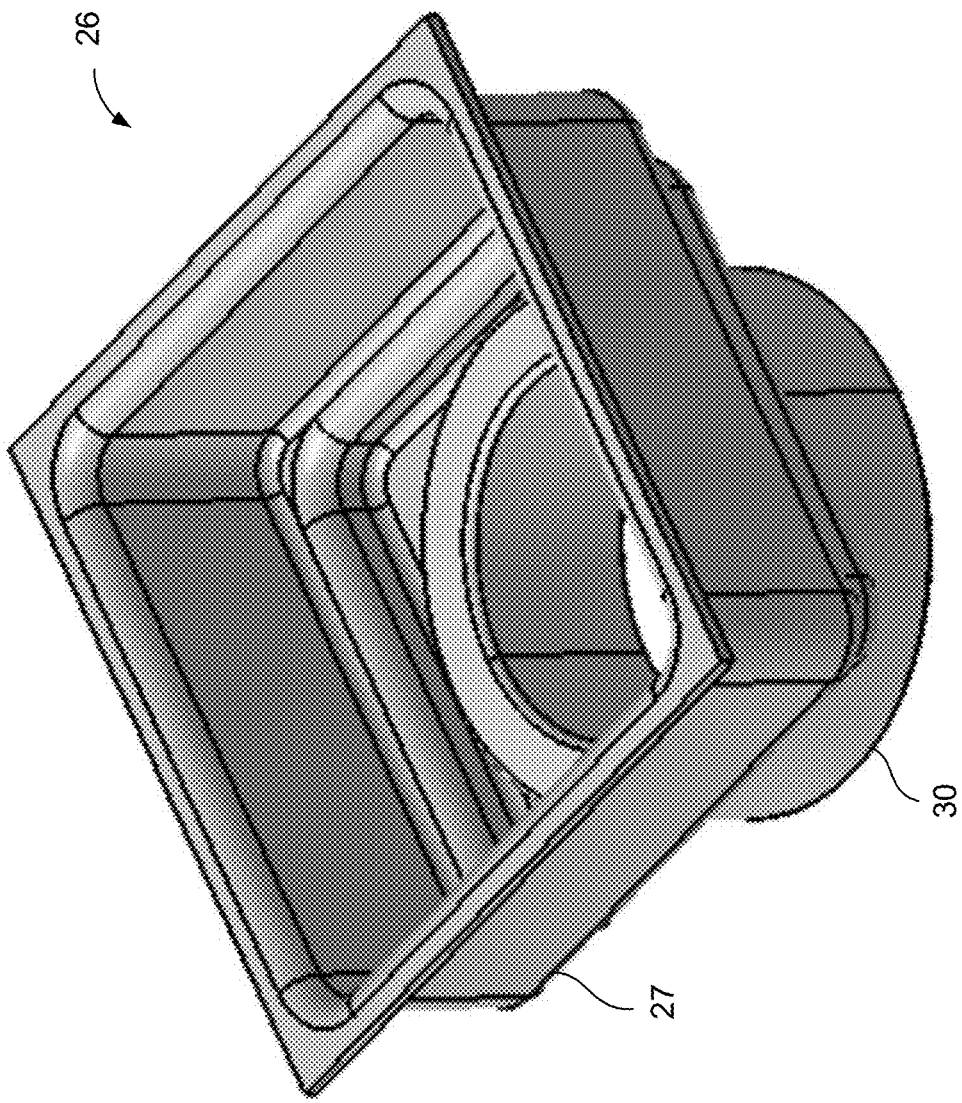
FIG. 4 is a perspective view of a front housing of the camera of FIG. 2.
Figure 5:
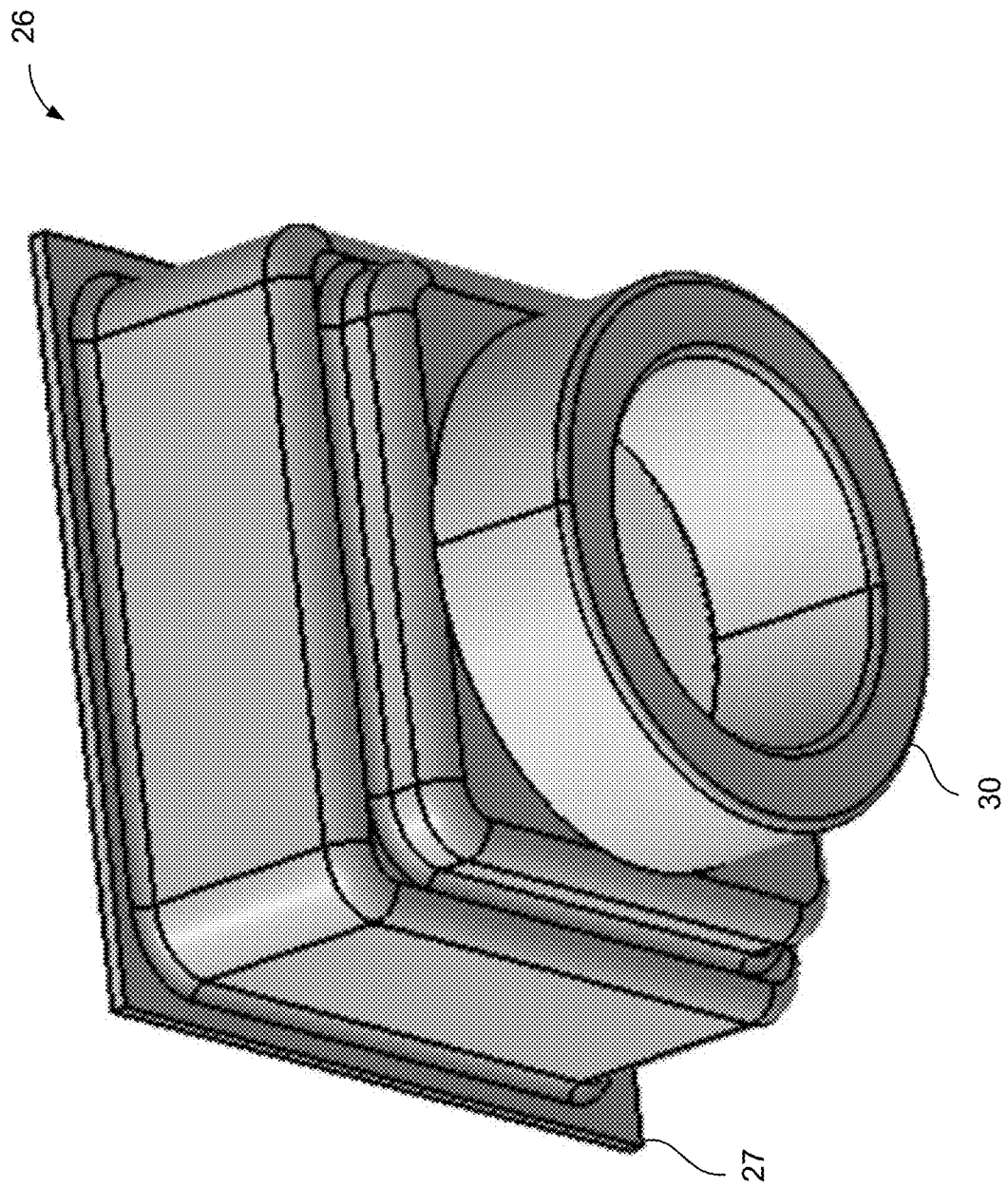
FIG. 5 is another perspective view of the front housing of the camera of FIG. 2.
Figure 6:
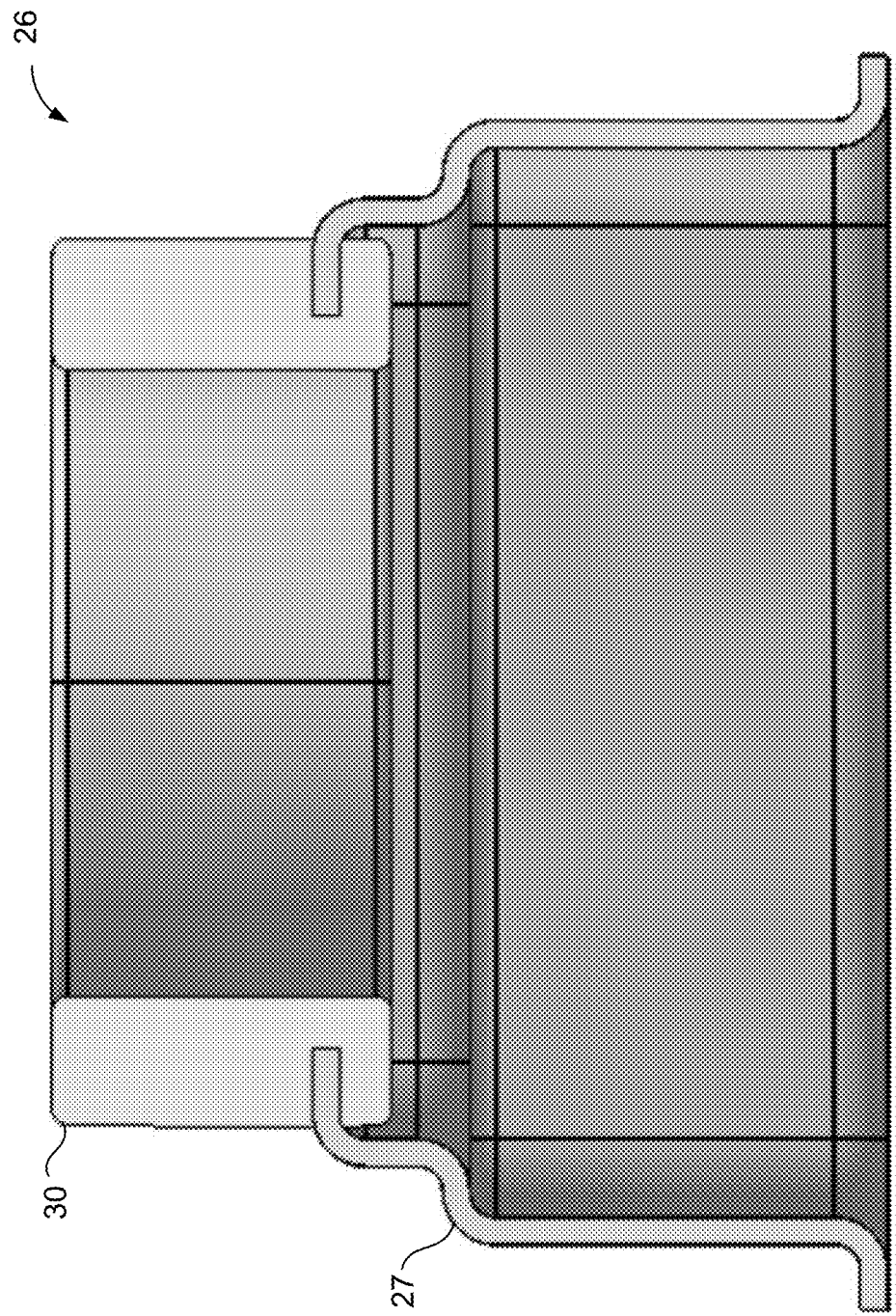
FIG. 6 is a cross-section of the front housing of FIGS. 4 and 5.
Figure 7:
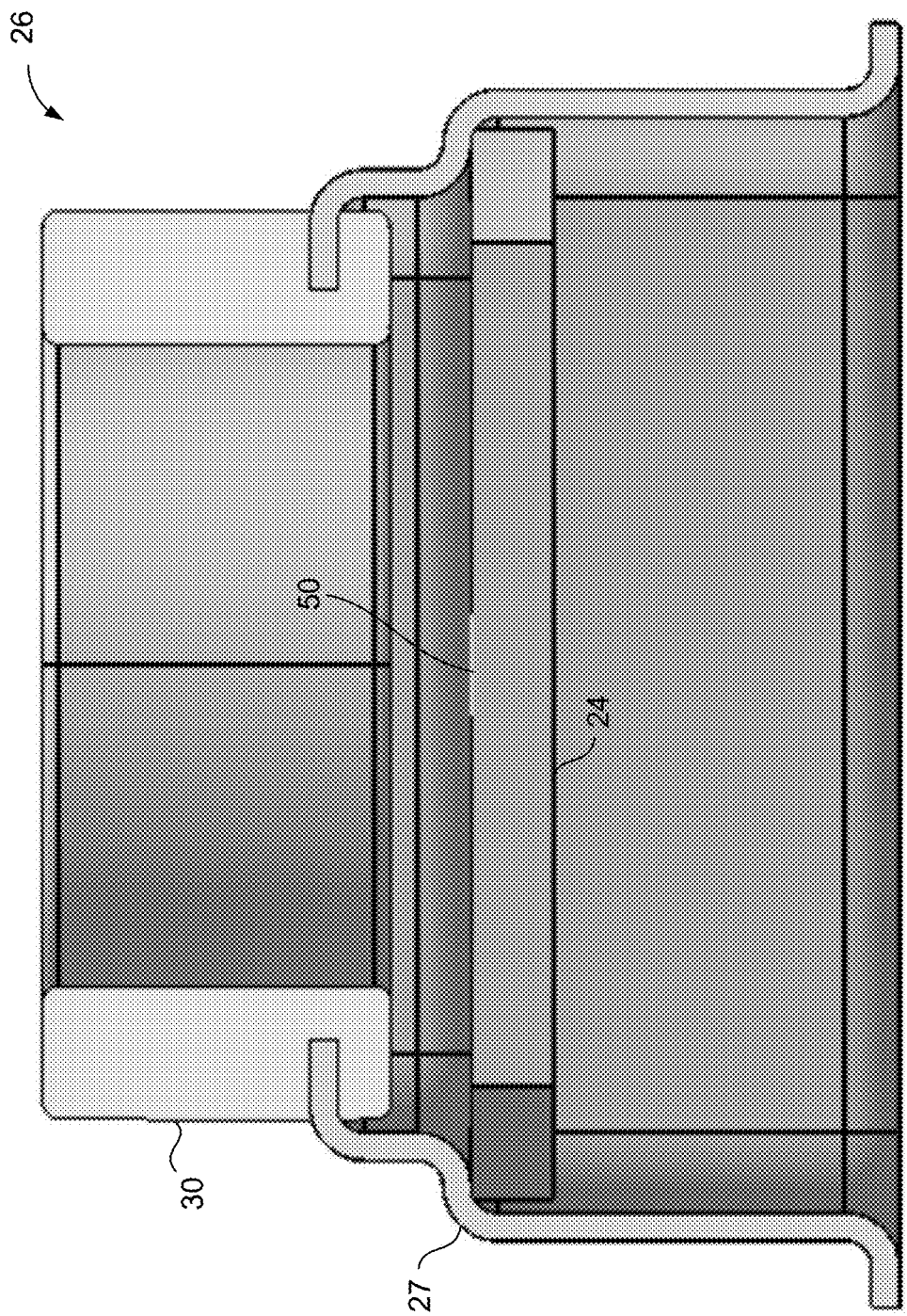
FIG. 7 is a cross-section of the front housing of FIG. 6, with a printed circuit board disposed therein.

FIGS. 4-6 show the front housing 26 including the high CTE portion 30 and the low CTE thin wall portion 27. As shown in FIGS. 4-6, the high CTE portion 30 includes a plastic (or other higher CTE material) annular portion for bonding to a flange of the lens barrel. A portion of the lens barrel may protrude through the ring formed by the high CTE portion 30 and into the cavity of the front housing 26 and the rear housing 28. As illustrated in the cross-sectional view of FIG. 7, the PCB 24 is disposed within the front housing 26 and an imager 50 is aligned with the ring formed by the high CTE portion 30 such that when the lens barrel is disposed within the ring, the imager 50 is aligned axially with the lens barrel.

Figure 8:
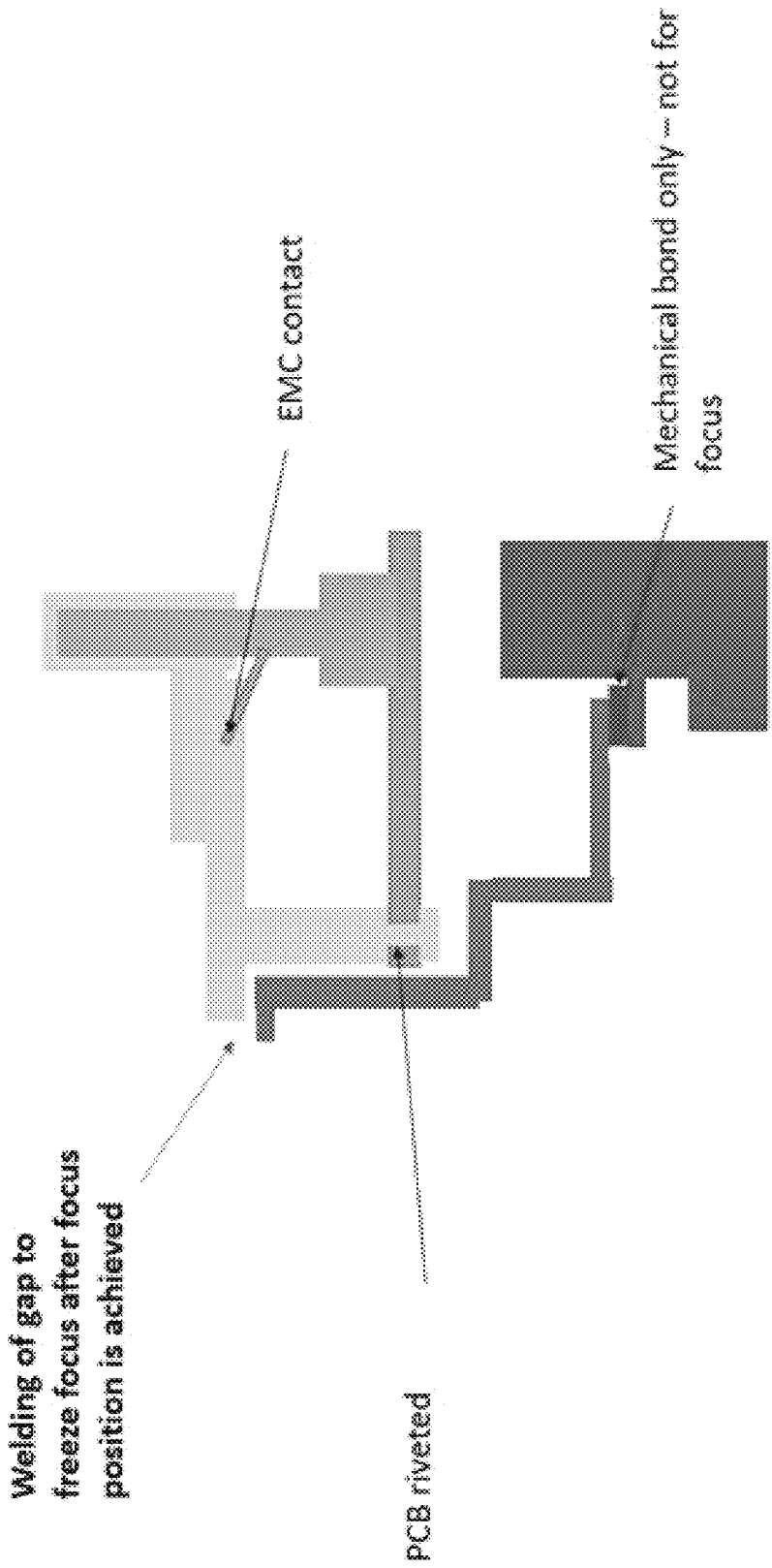
FIG. 8 is a cross-sectional view of a portion of a camera including housing portions having materials with different coefficient of thermal expansions and gap welding.
Figure 11:
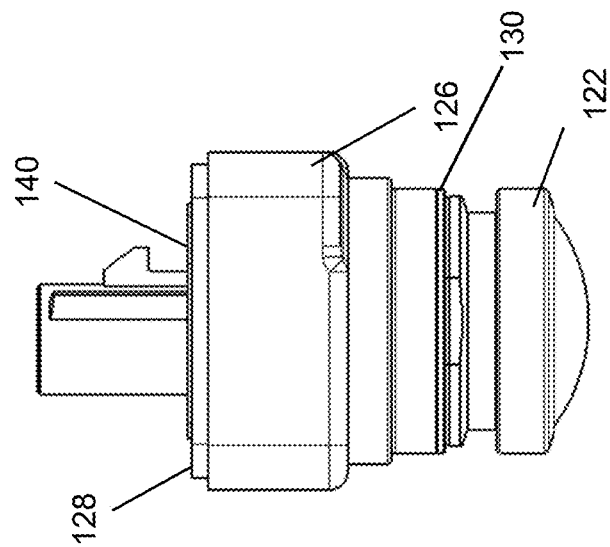
FIGS. 9-11 are perspective views of a camera having a lens attachment feature having a higher coefficient of thermal expansion overmolded over a front housing having a lower coefficient of thermal expansion.
Figure 10:
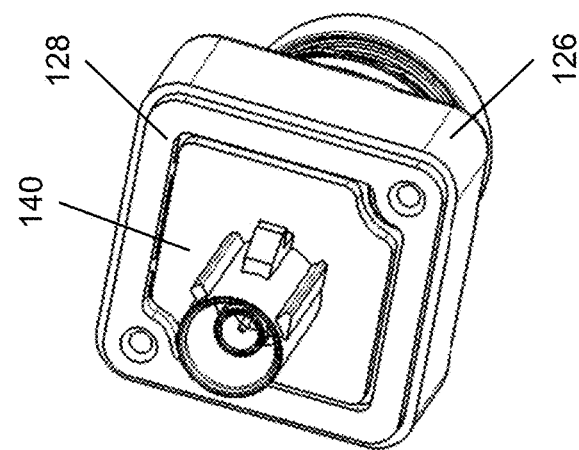
Figure 9:
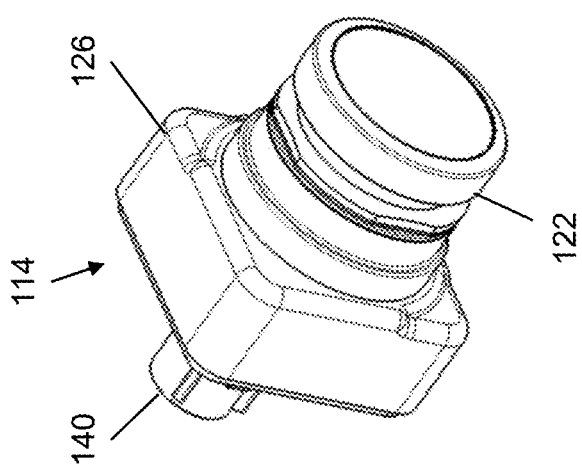

Referring now to FIG. 8, optionally, the mating interface connecting the thin wall and the rear wall may be welded (e.g., via laser welding) across an air gap separating the thin wall and the rear wall. For example, the focus position may be achieved and then the interface may be welded to "freeze" the focus of the camera (i.e., during a focus and alignment and/or calibration process). Thus, closing or sealing of the camera and focusing of the camera can be completed with a single fast step, which saves both time and cost (e.g., from adhesive curing such as ultraviolet glue curing). As shown in FIG. 8, the PCB may be riveted or otherwise mechanically attached at the rear housing portion, and the lens barrel may be bonded at the front camera housing or lens holder.

Referring now to FIGS. 9-15C, a vehicular camera 114 may include a metallic front housing 126 (having a low CTE portion 127 (FIG. 12C)) mated to or joined with a metallic rear housing 128 with a plastic connector portion 140 attached to a rear surface of the metallic rear housing 128 and a lens attachment portion or holder 130 (i.e., a high CTE portion 130) that comprises a plastic resin or epoxy (having a high CTE relative to the CTE of the front housing 126 and/or the rear housing 128) overmolded over the front housing 126 and that receives the lens barrel 122. That is, the high CTE portion 130 may be overmolded over the low CTE portion 127 of the front housing 126 to bond the high CTE and low CTE portions. The low CTE portion 127 of the front housing 126 and the rear housing 128 may comprise any suitable material having a low CTE, such as a metallic material like aluminum. The low CTE portion 127 of the front housing may be a thin walled portion (i.e., have a reduced thickness) of the front housing 126 to allow for more room within the housing for a PCB 124 (FIG. 13), which is received within the front housing 126 and/or rear housing 128.

The lens barrel 122 is bonded or adhered to the high CTE portion 130 after focus and alignment of the lens of the lens barrel with the imager 150 of the PCB 124, such as via, for example, an adhesive 134 between a flange of the lens barrel 122 and an upper or outer surface of the high CTE portion 130. Thus, the high CTE portion 130 separates the lens barrel 122 from the low CTE portion 127 of the front housing 126. That is, the lens barrel (which may have a similar CTE to the CTE of the high CTE portion) maintains contact with the high CTE portion 130 and is at least partially isolated from direct contact with the low CTE portion 127 of the front housing 126 and/or rear housing 128. When the adhesive 134, lens barrel 122, and/or other components of the camera 114 expand or contract (e.g., due to temperature changes), the high CTE portion 130 expands or contracts in a corresponding manner to maintain focus and alignment of the lens and imager 150.

As shown in FIGS. 12A-12C, the high CTE portion 130 (e.g., the plastic resin or epoxy) may be overmolded over any suitable portion of the front housing 126. For example, the high CTE portion 130 may be disposed only at an annular portion of the front housing that bonds to the flange of the lens barrel 122 (FIG. 12A). Optionally, such as shown in FIG. 12B, the high CTE portion 130 may be disposed at substantially the entirety of the outer surface of the front housing 126 (e.g., the annular lens engaging portion and the outer walls). Optionally, the front housing 126 may not have any high CTE material overmolded thereat and the lens barrel 122 may be bonded to the low CTE portion 127 directly via the adhesive (FIG. 12C). In this example, the adhesive may serve as the high CTE portion separating the lens barrel 122 from the front housing 126 in lieu of the overmolded high CTE material 130.

Figure 13:
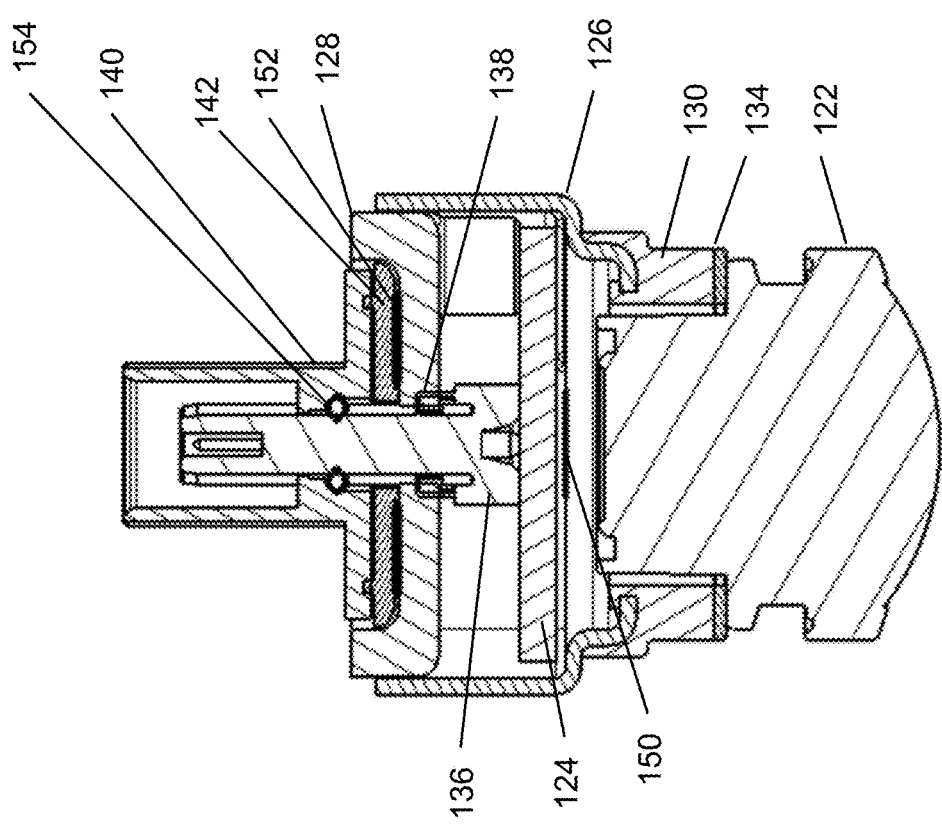
FIGS. 13 and 14 are cross-sectional views of the camera of FIGS. 9-11.
Figure 14:
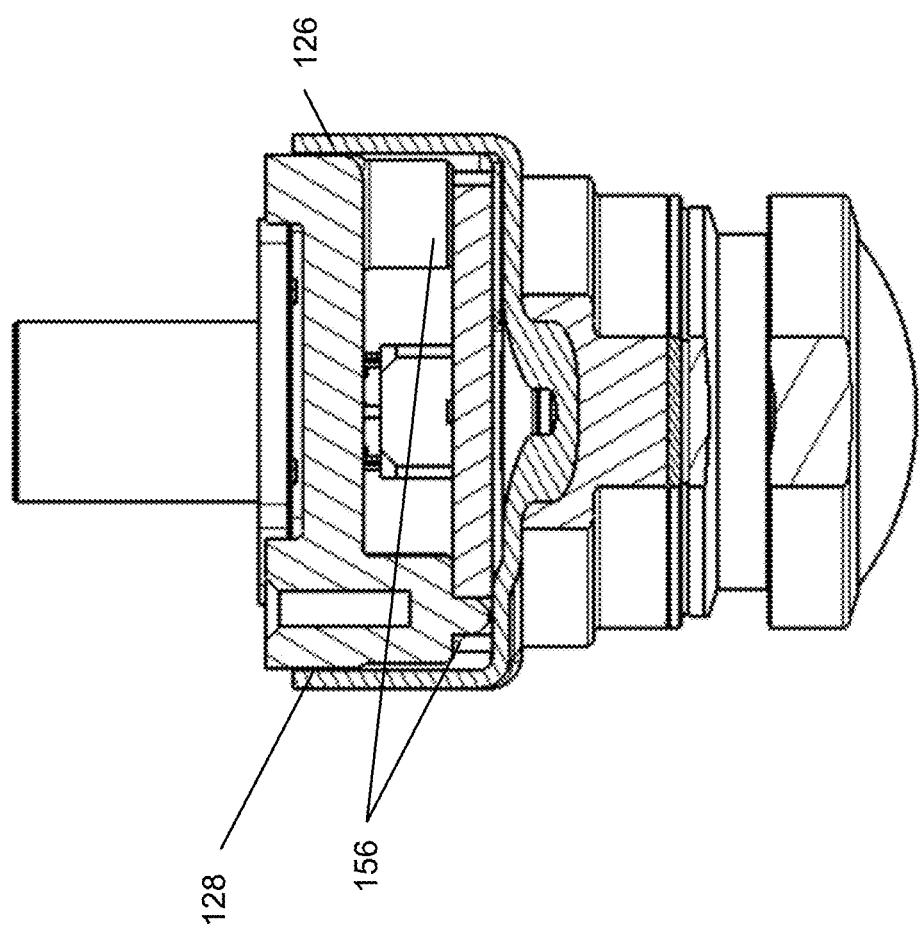
Figure 18:
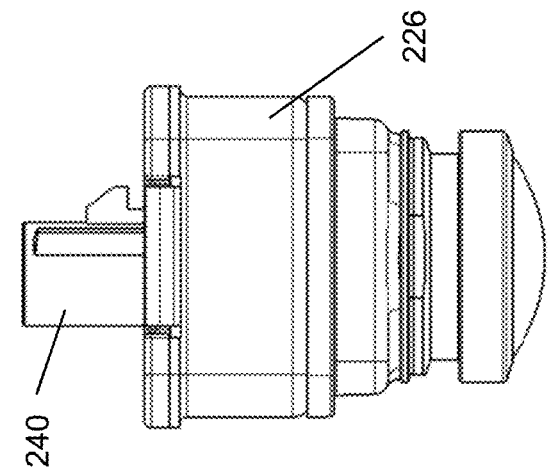
FIGS. 16-18 are perspective views of a camera having a lens attachment feature having a higher coefficient of thermal expansion adhered to a metallic front housing having a lower coefficient of thermal expansion where the metallic front housing has edge portions crimped over peripheral flanges of a plastic rear housing.
Figure 17:
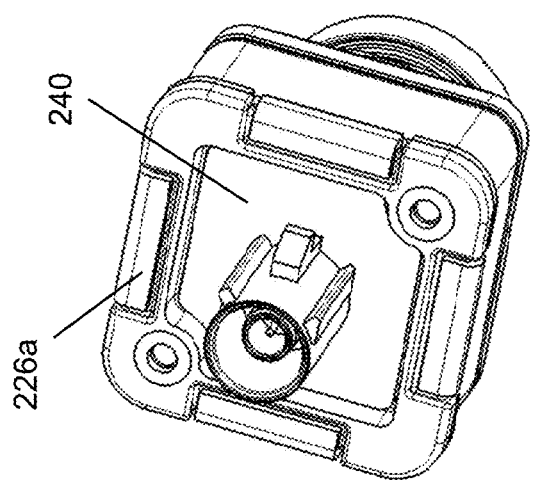
Figure 16:
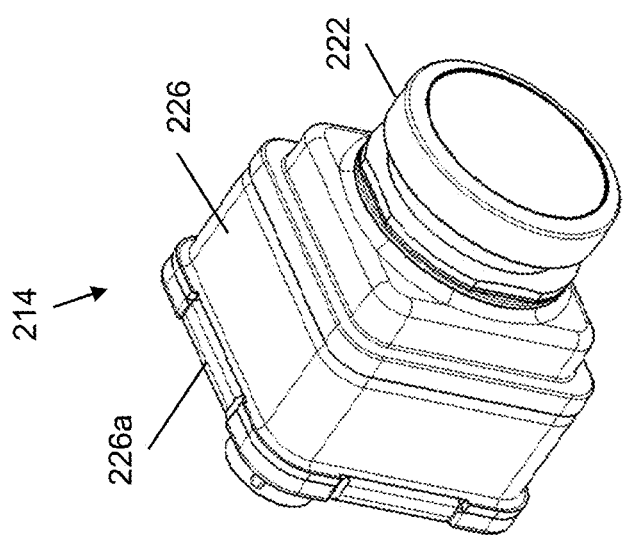

With the lens barrel 122 received at the lens attachment portion 130 of the front housing 126 and the PCB 124 received within the front housing 126 and/or rear housing 128, and with the imager 150 at a first side of the PCB 124 facing the lens barrel 122, a connector 136 electrically connects at and extends from a second side of the PCB opposite the first side and toward the rear housing 128. As shown in FIG. 13, the connector 136 may extend through an aperture in the rear housing 128 and may be received at or overmolded by a connector portion 140 configured to electrically connect to a connector of a vehicle wire harness or cable. An electrical contact 138 may be disposed at the aperture in the rear housing 128 to electrically connect or ground the connector 136 and the metallic rear housing 128. The connector portion 140 may comprise a plastic or polymeric material that is attached to a rear surface of the metallic rear housing 128 via an adhesive 152 and, optionally, a plastic laser absorbing plate or seal or gasket 142 may be disposed between the connector portion 140 and the rear housing 128. The plastic laser absorbing plate 142 may be laser welded to the connector portion 140 and adhered to the rear housing via the adhesive 152. Optionally, an O-ring or seal or gasket 154 may be disposed along a passageway of the connector portion 140 and circumscribing the connector 136 to preclude moisture or contaminants from entering the housing of the camera 114.

To locate the rear housing 128 relative to the front housing 126, the rear housing may be press-fit to the front housing 126 and the rear housing may include pins 156 (FIG. 14) to locate the PCB 124. The PCB 124 may be compressed between the rear housing 128 and the front housing 126 in one or more, such as two or more, locations.

The front housing 126 may be directly mated or joined with the rear housing 128, such as via a welding joint between respective side walls of the front housing 126 and rear housing 128. For example, FIGS. 15A-15C depict alternate geometries for a metal laser weld joint between the front housing 126 and rear housing 128. FIG. 15A shows a weld joint where the low CTE portion 127 of the front housing 126 is laser welded to the rear housing 128 and extends past an edge or rearmost surface of the rear housing 128 (i.e., the rear housing 128 is recessed into the front housing 126). FIG. 15B shows a weld joint where the low CTE portion 127 of the front housing 126 is laser welded to the rear housing 128 and the rear housing 128 protrudes or extends from the edge of the front housing 126. FIG. 15C shows a weld joint where the low CTE portion 127 of the front housing 126 is laser welded to the rear housing 128 and the edge of the front housing 126 is flared outward from the rear housing 128 (and optionally aligned with an edge of the rear housing) to provide a lip 126a of the front housing 126.

Referring now to FIGS. 16-21, a vehicular camera 214 may include a metallic front housing 226 (having a low CTE portion 227) mated to or joined with a plastic rear housing 228 (FIG. 19) with a plastic connector portion 240 attached to a rear surface of the plastic rear housing 228 and a plastic lens attachment portion or lens mount 230 (i.e., a high CTE portion 230) that is disposed at the front housing 126 and that receives the lens barrel 222. The high CTE portion 230 is attached to the low CTE portion 227 of the front housing 226 via an adhesive or sealing gasket 258 disposed at the outer surface of the front housing 226 between the high CTE lens mount 230 and the front housing 226. The PCB 224 accommodating the imager 250 is received within the front housing 226 and/or rear housing 228 so that the imager 250 is aligned with the lens of the lens barrel 222 when the lens barrel 222 is received at the high CTE portion 230 and/or front housing 226. The lens barrel 222 may be bonded to or in contact with the high CTE portion 230 after focus and alignment of the lens of the lens barrel with the imager 250, such as via an adhesive 234 between a flange of the lens barrel 222 and an upper or outer surface of the high CTE portion 230. That is, the high CTE portion 230 may be adhered directly to the outer surface of the front housing 226 and the lens barrel 222 may be adhered directly to the high CTE portion 230. The high CTE portion 230 isolates or separates the lens barrel 222 from the low CTE portion 227 of the front housing 226.

Figure 19:
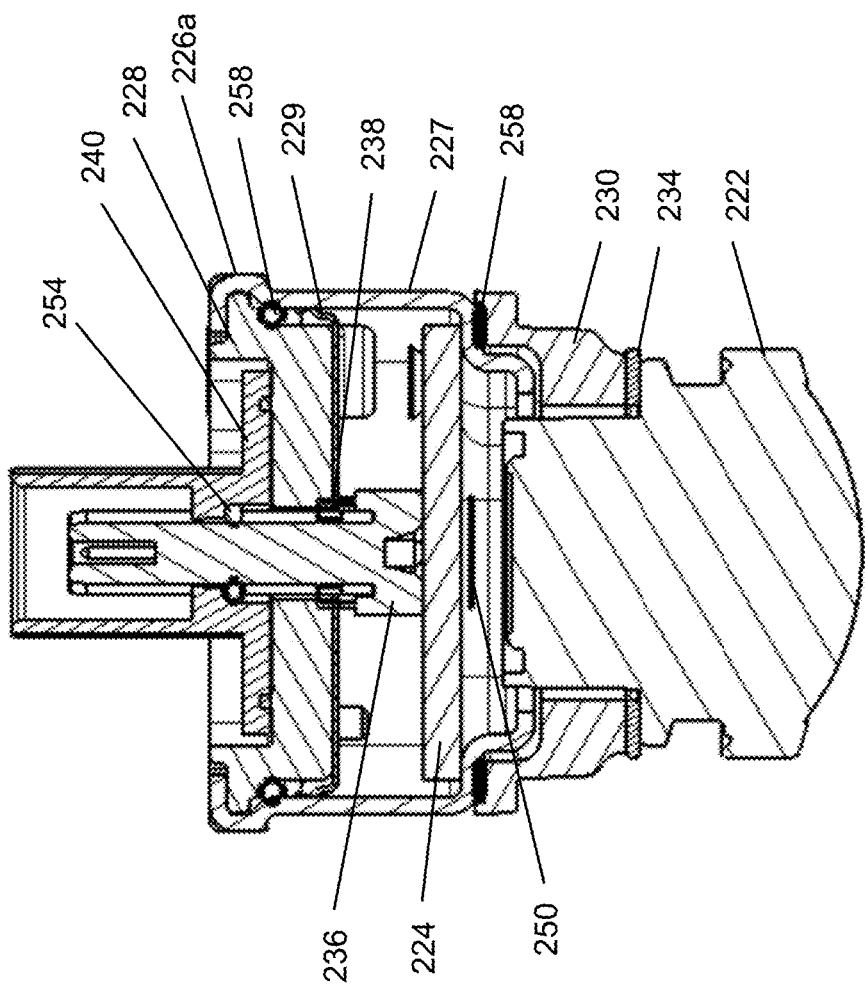
FIG. 19 is a cross-sectional view of the camera of FIGS. 16-18.

The rear housing 228 may be a plastic rear housing having peripheral flanges and edges 226a of the front housing 226 may be crimped or clamped over the peripheral flanges of the rear housing 228 to mate or join the front and rear housings together. For example, the edge portions 226a of the front housing 226 may bend over and around the peripheral flanges of the rear housing 228. Further, the plastic rear housing 228 may include a metallic wall or shield or stamping 229 at an inner surface of the rear housing 228 facing the second surface of the PCB 224 to reduce electromagnetic interference with the imager 250 (FIG. 19).

A connector 236 electrically connects to and extends from a side of the PCB 224 opposite the imager 250 toward and through an aperture in the rear housing 228 and is received in or overmolded by a connector portion 240 configured to electrically connect to a connector of a vehicle wire harness or cable. An electrical contact 238 may be disposed at the aperture in the rear housing 228 to electrically connect or ground the connector 236 to the metallic stamping 229. A first O-ring or seal or gasket 254 may be disposed along a passageway of the connector portion 240 and circumscribing the connector 236 and a second O-ring or seal or gasket 258 may be disposed circumscribing the rear housing 228 and at the interface between the rear and front housings to preclude moisture or contaminants from entering the housing. The plastic connector portion 240 may be directly attached, such as via a plastic laser weld, to the rear surface of the rear housing 228.

Figure 20:
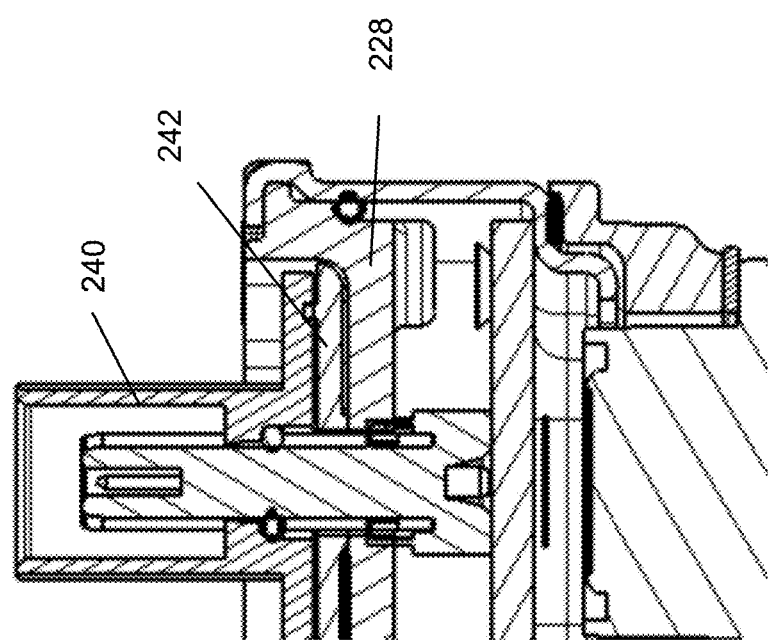
FIG. 20 is a cross-sectional view of the camera of FIGS. 16-18 having a metallic rear housing.

Optionally, and such as shown in FIG. 20, the rear housing 228 may comprise a metallic rear housing (to provide the electromagnetic shielding), such that the camera does not include a metal stamping (similar to metal stamping 229 in FIG. 19), with the camera including an adhered or glued plastic plate 242 for laser welding the plastic connector 240 to the rear surface of the rear housing 228.

Figure 21:
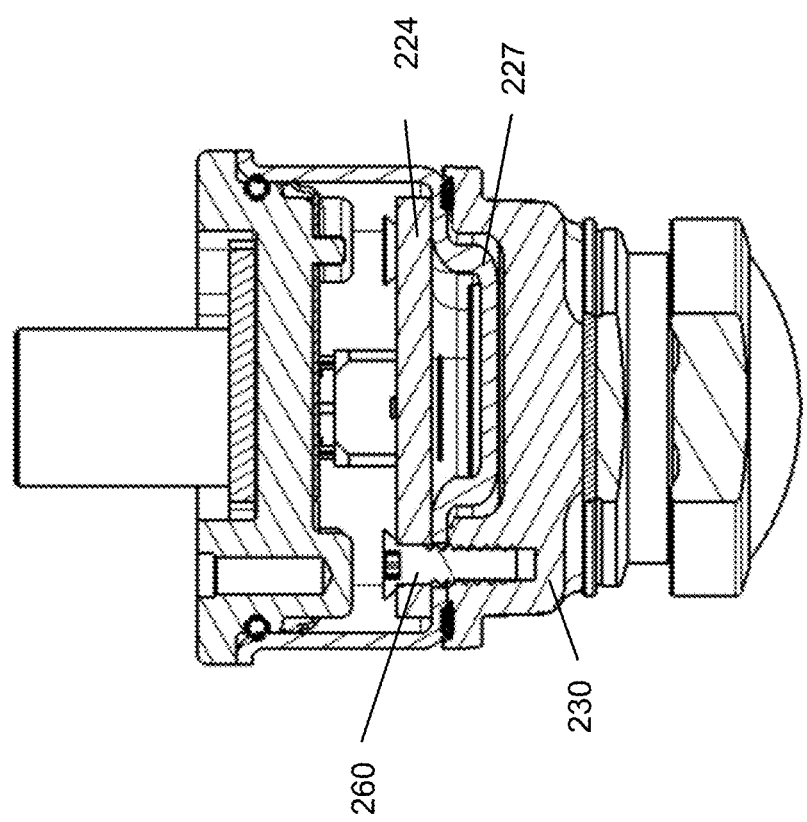
FIG. 21 is a cross-sectional view of the camera of FIGS. 16-18, showing the imager printed circuit board fixed to the front housing via screws.

As shown in FIG. 21, the PCB 224 may be fixed or attached to the front housing 226, such as via screws 260 or other fasteners. The screws 260 may pass through the low CTE portion 227 of the front housing and be received within the high CTE portion 230. The metallic, low CTE portion 227 of the front housing 226 is sandwiched between the PCB 224 and high CTE portion 230 for transfer of heat away from the PCB.

Thus, the vehicular camera provides a housing accommodating an imager PCB and having low CTE portions that (i) maximize space available for the PCB and one or more high CTE portions and/or (ii) prevent shifting of the imager relative to the lens of the camera along a plane of the imager (i.e., X and Y axes) during temperature changes, and having high CTE portions that offset or account for movement of the lens relative to the imager along a longitudinal or viewing axis of the imager and lens (i.e., Z axis).

The camera may otherwise utilize suitable construction for controlling or accommodating changes in the camera when the camera is exposed to extreme temperatures, such as below −20 degrees C. or below −40 degrees C. and/or above 60 degrees C. or above 80 degrees C., and may utilize aspects of cameras described in U.S. Pat. Nos. 10,750,064; 10,855,890; 10,678,018; 10,645,795; 10,899,275; 10,676,041 and/or 10,911,647, and/or U.S. Publication Nos. US-2020-0033549; US-2020-0137926; US-2020-0412925 and/or US-2021-0103119, which are hereby incorporated herein by reference in their entireties.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in U.S. Pat. No. 10,099,614 and/or 10,071,687, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. The imaging array may comprise a CMOS imaging array having at least 300,000 photosensor elements or pixels, preferably at least 500,000 photosensor elements or pixels and more preferably at least one million photosensor elements or pixels arranged in rows and columns. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in U.S. Pat. Nos. 10,071,687; 9,900,490; 9,126,525 and/or 9,036,026, which are hereby incorporated herein by reference in their entireties.

The imaging device and control and image processor and any associated illumination source, if applicable, may comprise any suitable components, and may utilize aspects of the cameras (such as various imaging sensors or imaging array sensors or cameras or the like, such as a CMOS imaging array sensor, a CCD sensor or other sensors or the like) and vision systems described in U.S. Pat. Nos. 5,760,962; 5,715,093; 6,922,292; 6,757,109; 6,717,610; 6,590,719; 6,201,642; 5,796,094; 6,559,435; 6,831,261; 6,822,563; 6,946,978; 7,720,580; 8,542,451; 7,965,336; 7,480,149; 5,877,897; 6,498,620; 5,670,935; 5,796,094; 6,396,397; 6,806,452; 6,690,268; 7,005,974; 7,937,667; 7,123,168; 7,004,606; 6,946,978; 7,038,577; 6,353,392; 6,320,176; 6,313,454 and/or 6,824,281, and/or International Publication Nos. WO 2009/036176; WO 2009/046268; WO 2010/099416; WO 2011/028686 and/or WO 2013/016409, and/or U.S. Publication Nos. US 2010-0020170 and/or US-2009-0244361, which are all hereby incorporated herein by reference in their entireties.

The camera assembly or module may utilize aspects of the cameras and connectors described in U.S. Pat. Nos. 10,272,857; 10,250,004; 10,230,875; 10,142,532; 9,621,769; 9,277,104; 9,077,098; 8,994,878; 8,542,451 and/or 7,965,336, and/or U.S. Publication Nos. US-2009-0244361; US-2013-0242099; US-2014-0373345; US-2015-0124098; US-2015-0222795; US-2015-0327398; US-2016-0243987; US-2016-0268716; US-2016-0286103; US-2016-0037028; US-2017-0129419; US-2017-0133811; US-2017-0201661; US-2017-0280034; US-2017-0295306 and/or US-2018-0098033, which are hereby incorporated herein by reference in their entireties.

The camera may include electrical connecting elements that accommodate tolerances in the housing and/or PCB mounting and/or connector portion. The electrical connecting elements may utilize aspects of the cameras and electrical connectors described in U.S. Pat. No. 9,233,641 and/or U.S. Publication Nos. US-2013-0242099; US-2014-0373345; US-2015-0222795; US-2015-0266430; US-2015-0365569; US-2016-0268716; US-2017-0133811; US-2017-0295306 and/or US-2017-0302829, which are hereby incorporated herein by reference in their entireties. Optionally, the electrical connections may be established via molded interconnect device (MID) technology, such as by utilizing aspects of the cameras described in U.S. Publication Nos. US-2018-0072239; US-2017-0295306 and/or US-2016-0037028, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular camera, the vehicular camera comprising:
   a printed circuit board (PCB) having a first side and a second side separated by a thickness of the PCB, wherein an imager is disposed at the first side of the PCB;
   a lens barrel accommodating a lens, the lens barrel comprising a first end and a second end and an annular flange disposed between the first end and the second end;
   a front camera housing comprising (i) a first portion formed of a first material having a first coefficient of thermal expansion (CTE) and (ii) a second portion formed of a second material having a second CTE, wherein the first CTE is higher than the second CTE;
   wherein the first portion of the front camera housing comprises an annular surface, and wherein the annular flange of the lens barrel is bonded to the annular surface of the first portion via adhesive;
   a rear camera housing; and
   wherein the rear camera housing and the second portion of the front camera housing are joined to encase the PCB within a cavity formed by joining the front camera housing and the rear camera housing.

2. The vehicular camera of claim 1, wherein the first material forming the first portion of the front camera housing is plastic.

3. The vehicular camera of claim 1, wherein the second material forming the second portion of the front camera housing is metal.

4. The vehicular camera of claim 1, wherein the adhesive has a third CTE that is higher than the second CTE.

5. The vehicular camera of claim 1, wherein the first portion of the front camera housing has a thickness that is greater than a thickness of the second portion of the front camera housing.

6. The vehicular camera of claim 1, wherein a thickness of the second portion of the front camera housing is less than 1 mm.

7. The vehicular camera of claim 1, wherein the second portion of the front camera housing is welded to the rear camera housing.

8. The vehicular camera of claim 7, wherein the second portion of the front camera housing is welded to the rear camera housing via an air gap weld.

9. The vehicular camera of claim 1, wherein the rear camera housing is overmolded with plastic, and wherein the rear camera housing and the second portion of the front camera housing are joined using a snap attachment.

10. The vehicular camera of claim 9, wherein the snap attachment comprises a plastic element that receives perimeter flanges of the rear camera housing and the second portion of the front camera housing.

11. The vehicular camera of claim 1, wherein the PCB is bonded to the first portion of the front camera housing via adhesive.

12. The vehicular camera of claim 1, wherein the first material of the first portion of the front camera housing is overmolded over the second material of the second portion of the front camera housing.

13. The vehicular camera of claim 12, wherein the first material is overmolded over the second material only at a lens barrel attachment portion of the front camera housing.

14. The vehicular camera of claim 1, wherein the rear camera housing comprises a plastic material.

15. The vehicular camera of claim 14, wherein a metallic shield is stamped onto a surface of the rear camera housing so that, with the rear camera housing and the front camera housing joined to encase the PCB, the metallic shield faces the second side of the PCB.

16. The vehicular camera of claim 1, wherein, with the annular flange of the lens barrel bonded to the front camera housing, the imager is aligned with the lens.

17. A vehicular camera, the vehicular camera comprising:
- a printed circuit board (PCB) having a first side and a second side separated by a thickness of the PCB, wherein an imager is disposed at the first side of the PCB;
- a lens barrel accommodating a lens, the lens barrel comprising a first end and a second end and an annular flange disposed between the first end and the second end;
- a front camera housing comprising (i) a plastic portion formed of a plastic having a first coefficient of thermal expansion (CTE) and (ii) a metal portion formed of a metal having a second CTE, wherein the first CTE is higher than the second CTE;
- wherein the plastic portion of the front camera housing comprises an annular surface, and wherein the annular flange of the lens barrel is bonded to the annular surface of the plastic portion via adhesive;
- a rear camera housing;
- wherein the rear camera housing and the metal portion of the front camera housing are joined to encase the PCB within a cavity formed by joining the front camera housing and the rear camera housing; and
- wherein part of the plastic portion of the front camera housing is overmolded over part of the metal portion of the front camera housing.

18. The vehicular camera of claim 17, wherein the plastic portion of the front camera housing has a thickness that is greater than a thickness of the metal portion of the front camera housing.

19. The vehicular camera of claim 17, wherein the PCB is bonded to the plastic portion of the front camera housing via adhesive.

20. The vehicular camera of claim 17, wherein the part of the plastic portion is overmolded over the metal portion only at a lens barrel attachment portion of the front camera housing.

21. A vehicular camera, the vehicular camera comprising:
- a printed circuit board (PCB) having a first side and a second side separated by a thickness of the PCB, wherein an imager is disposed at the first side of the PCB;
- a lens barrel accommodating a lens, the lens barrel comprising a first end and a second end and an annular flange disposed between the first end and the second end;
- a front camera housing comprising (i) a first portion formed of a first material having a first coefficient of thermal expansion (CTE) and (ii) a second portion formed of a second material having a second CTE, wherein the first CTE is higher than the second CTE;
- wherein the first portion of the front camera housing comprises an annular surface, and wherein the annular flange of the lens barrel is bonded to the annular surface of the first portion via adhesive;
- a rear camera housing;
- wherein the rear camera housing and the second portion of the front camera housing are joined to encase the PCB within a cavity formed by joining the front camera housing and the rear camera housing;
- wherein the first portion of the front camera housing has a thickness that is greater than a thickness of the second portion of the front camera housing; and
- wherein the second portion of the front camera housing is welded to the rear camera housing.

22. The vehicular camera of claim 21, wherein the first material forming the first portion of the front camera housing is plastic.

23. The vehicular camera of claim 21, wherein the second material forming the second portion of the front camera housing is metal.

24. The vehicular camera of claim 21, wherein the adhesive has a third CTE that is higher than the second CTE.

* * * * *